(12) United States Patent
Zhu (10) Patent No.: US 8,896,062 B2
(45) Date of Patent: *Nov. 25, 2014

(54) SEMICONDUCTOR DEVICE AND METHOD FOR FORMING THE SAME

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 63 days.

This patent is subject to a terminal disclaimer.

(21) Appl. No.: 13/143,931

(22) PCT Filed: Feb. 24, 2011

(86) PCT No.: PCT/CN2011/071264
§ 371 (c)(1),
(2), (4) Date: Jul. 10, 2011

(87) PCT Pub. No.: WO2011/147212
PCT Pub. Date: Dec. 1, 2011

(65) Prior Publication Data
US 2012/0126332 A1    May 24, 2012

(30) Foreign Application Priority Data

May 25, 2010 (CN) .......................... 2010 1 0189992

(51) Int. Cl.
| H01L 27/12 | (2006.01) |
| H01L 21/84 | (2006.01) |
| H01L 21/336 | (2006.01) |
| H01L 27/088 | (2006.01) |
| H01L 29/78 | (2006.01) |
| H01L 29/66 | (2006.01) |

(52) U.S. Cl.
CPC ........ *H01L 29/785* (2013.01); *H01L 29/66795* (2013.01); *H01L 29/66803* (2013.01)
USPC ................... 257/347; 257/401; 257/E27.112; 438/151; 438/157; 438/283; 438/300

(58) Field of Classification Search
USPC .................... 257/77, 329, 369, 183, E29.068, 257/E21.409, E21.632, E27.062, E29.262, 257/E21.41, 347; 438/143, 157, 199, 156, 438/151, 283, 300, 302, 303, 305, 306, 369, 438/370, 372, 505, 506, 519
See application file for complete search history.

(56) References Cited

U.S. PATENT DOCUMENTS

| 5,739,057 | A | * | 4/1998 | Tiwari et al. ................... 438/172 |
| 6,358,806 | B1 | * | 3/2002 | Puchner ....................... 438/308 |
| 6,396,108 | B1 | * | 5/2002 | Krivokapic et al. .......... 257/365 |

(Continued)

*Primary Examiner* — Mary Wilczewski
*Assistant Examiner* — Erik T Peterson
(74) *Attorney, Agent, or Firm* — Goodwin Procter LLP (57) ABSTRACT

The invention provides a semiconductor device, including: a semiconductor base, on an insulation layer; source/drain regions abutting opposite first sides of the semiconductor base; and gates at opposite second sides of the semiconductor base, wherein the semiconductor base includes a cavity, and the insulation layer is exposed by the cavity. The invention also provides a method for forming a semiconductor device, including: forming a semiconductor bottom on an insulation layer; forming source/drain regions, the source/drain regions abutting opposite first sides of the semiconductor bottom; forming gates on opposite second sides of the semiconductor bottom; and removing a part of the semiconductor bottom to form a cavity in the semiconductor bottom, the cavity exposing the insulation layer. With the technical solutions provided by the invention, short-channel effects can be alleviated, and the resistance of the source/drain regions and parasitic capacitance can be reduced.

23 Claims, 9 Drawing Sheets

(56) References Cited

U.S. PATENT DOCUMENTS

| | | | |
|---|---|---|---|
| 6,413,802 B1 | 7/2002 | Hu et al. | |
| 6,610,576 B2* | 8/2003 | Nowak | 438/301 |
| 6,709,982 B1* | 3/2004 | Buynoski et al. | 438/696 |
| 6,727,546 B2* | 4/2004 | Krivokapic et al. | 257/331 |
| 6,762,448 B1* | 7/2004 | Lin et al. | 257/302 |
| 6,800,885 B1* | 10/2004 | An et al. | 257/275 |
| 6,921,963 B2* | 7/2005 | Krivokapic et al. | 257/618 |
| 6,939,751 B2* | 9/2005 | Zhu et al. | 438/151 |
| 7,456,068 B2* | 11/2008 | Kavalieros et al. | 438/301 |
| 7,601,574 B2* | 10/2009 | Pan | 438/183 |
| 7,679,134 B1 | 3/2010 | Buynoski et al. | |
| 2002/0033511 A1* | 3/2002 | Babcock et al. | 257/408 |
| 2003/0178677 A1* | 9/2003 | Clark et al. | 257/347 |
| 2004/0256647 A1* | 12/2004 | Lee et al. | 257/289 |
| 2005/0112817 A1* | 5/2005 | Cheng et al. | 438/219 |
| 2005/0145941 A1* | 7/2005 | Bedell et al. | 257/348 |
| 2005/0156202 A1* | 7/2005 | Rhee et al. | 257/213 |
| 2006/0063332 A1* | 3/2006 | Doyle et al. | 438/267 |
| 2009/0026530 A1* | 1/2009 | Wilson et al. | 257/328 |

\* cited by examiner

SEMICONDUCTOR DEVICE AND METHOD FOR FORMING THE SAME

CROSS REFERENCE TO RELATED APPLICATIONS

This application is a Section 371 national stage application of International Application No. PCT/CN2011/071264 filed on Feb. 24, 2011, which claims priority to 201010189992.9 filed on May 25, 2010, the contents of which are incorporated herein by reference in their entirety.

FIELD OF THE INVENTION

The present invention relates to semiconductor technology, and particularly to a semiconductor device and a method for forming the same.

BACKGROUND OF THE INVENTION

The scaling of channel length of Metal Oxide Semiconductor Field Effect Transistors (MOSFETs) causes a number of effects that are negligible in long-channel models to become significant or even a dominant factor in performance degradation. These are known as short-channel effects. Short-channel effects may result in deteriorated electrical performance of devices, e.g., gate threshold voltage dropping, power consumption increasing, and signal-to-noise ratio (SNR) decreasing.

To control short channel effects, more impurities such as phosphorus and boron are introduced into the channel, which, however, may lead to a decreased mobility of carriers in the channel of the device, an uncontrollable abruptness of impurity distribution, or even more severe short-channel effects. Moreover, it is difficult for the conventional strained SiGe PMOS technology to provide an ever greater stress in the channel. Furthermore, the thickness of gate oxide dielectric is becoming a bottleneck since the speed at which the thickness is reduced can no longer keep up with gate width decreasing, and gate leakage currents is increasing. In addition, as the feature size shrinks, the resistance of the source/drain region is increasing and so is the power consumption of the device.

At present, a prominent solution in the art is to change the conventional planar structure, intending to reduce the thickness of the channel region and eliminate the electrical neutral layer under the depletion layer in the channel, so that the depletion layer can fill up the channel region. This is known as a Fully Depleted (FD) device, and conventional planar devices are Partially Depleted (PD) devices.

However, the manufacturing of FD devices requires an extremely thin silicon layer in the channel. Conventional manufacturing processes, especially those that are bulk silicon-based, cannot meet this requirement or are too expensive. Even for the newly developed silicon-on-insulator (SOI) technology, still, it is hard to control the thickness of the silicon layer at a desired level. Therefore, the searching for the general solution for FD devices has been directed to 3-dimensional device structures, i.e., FD double gate technique or tri-gate technique.

The 3-dimensional device structure (vertical device structure as referred to in some documents) is a technology whereby the cross-sections of the source/drain region and the gate are not in the same plane, substantially a fin field-effect transistor (FinFET) structure.

In the 3-dimensional device structure, instead of being within the bulk silicon or the SOI, the channel region is separated from these structures. Consequently, it is possible to make an FD channel having an extremely thin thickness with, e.g., etching.

Figure 1:
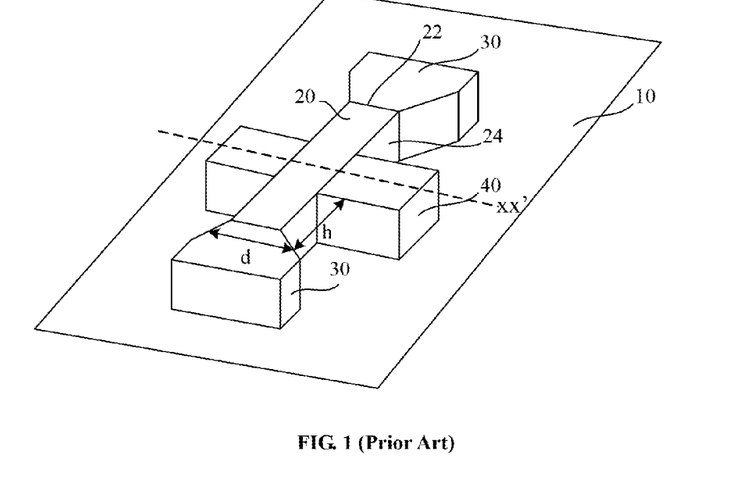
FIG. 1 is a structural diagram of a semiconductor device in the prior art.

A known 3-dimensional semiconductor device is shown in FIG. 1. The semiconductor device includes: a semiconductor base 20, which is on an insulation layer 10; source/drain regions 30 abutting the opposite first sides 22 of the semiconductor base 20; and gates 40, which are on the opposite second sides 24 adjacent to the first sides 22 (A gate dielectric layer and a work-function metal layer that are sandwiched between the gate 40 and the semiconductor base 20 are not shown). In order to reduce the resistance of the source/drain regions, edges of the source/drain regions 30 may be extended. As a result, the width (in xx' direction) of the source/drain regions 30 is larger than that of the semiconductor base 20. With the width (d) of the source/drain regions 30 increased, the parasitic capacitances between the source/drain regions 30 and the gate 40, and between the source/drain regions 30 and the semiconductor base 20 increase, which may lead to an increased resistance-capacitance delay or deteriorated AC performance of the device.

SUMMARY OF THE INVENTION

In order to solve the problems above, the present invention provides a semiconductor device and a method for forming the same, which may alleviate short-channel effects, and reduce the resistance of the source/drain regions and parasitic capacitance.

The invention provides a semiconductor device, comprising:

a semiconductor base, which is on an insulation layer;

source/drain regions abutting opposite first sides of the semiconductor base; and gates, which are at opposite second sides of the semiconductor base, wherein the semiconductor base comprises a cavity, and the insulation layer is exposed by the cavity.

Optionally, a channel layer and a mask layer are sandwiched between each of the second sides and the cavity, and the channel layer is sandwiched between the insulation layer and the mask layer.

Optionally, the first sides are perpendicular to the second sides.

Optionally, the channel layer has a thickness of 5 nm to 40 nm in the direction perpendicular to the second sides.

Optionally, if the semiconductor device is an NMOS device, the channel layer includes a P-type super-steep retrograde well; and if the semiconductor device is a PMOS device, the channel layer includes an N-type super-steep retrograde well.

Optionally, in the direction perpendicular to the insulation layer, the gate covers at least the channel layer.

Optionally, the semiconductor device further comprises a semiconductor assistant base, and wherein the upper surface of the semiconductor assistant base is lower than the upper surface of the semiconductor base, the semiconductor assistant base abutting the first sides, and the source/drain regions are formed on the semiconductor assistant base.

Optionally, the semiconductor assistant base contains Si, if the semiconductor device is a PMOS device, the source/drain regions are made of $Si_{1-X}Ge_X$; and if the semiconductor device is an NMOS device, the source/drain regions are made of Si:C.

Optionally, in the $Si_{1-X}Ge_X$, X has a value ranging from 0.1 to 0.7.

Optionally, in the Si:C, C has an atomic percentage ranging from 0.2% to 2%.

Optionally, the cavity is filled with an insulation material.

Optionally, the insulation material is any one or a combination of: silicon nitride and silicon oxide.

The invention provides a method for forming a semiconductor device, comprising:

forming a semiconductor bottom on an insulation layer;

forming source/drain regions abutting opposite first sides of the semiconductor bottom;

forming gates at opposite second sides of the semiconductor bottom; and removing a part of the semiconductor bottom to form a cavity in the semiconductor bottom, wherein the cavity exposes the insulation layer.

Optionally, the step for forming a semiconductor bottom comprises:

forming a first semiconductor layer, a stopping layer, a patterned sacrificial layer, a patterned protection layer, and a first sidewall spacer surrounding the patterned sacrificial layer and protection layer;

forming patterned stopping layer and first semiconductor layer by using the first sidewall spacer as a mask;

defining the source/drain regions, and removing the first sidewall spacer, the protection layer, and the sacrificial layer over the regions to expose the stopping layer; and forming a second sidewall spacer surrounding the protection layer and the sacrificial layer, and wherein, the step for forming the cavity in the semiconductor bottom comprises:

removing the protection layer, the sacrificial layer and the first semiconductor layer by using the first sidewall spacer and the second sidewall spacer as a mask, wherein the material of the stopping layer is different from that of the protection layer, the sacrificial layer, the first semiconductor layer, the first sidewall spacer or the second sidewall spacer.

Optionally, the first sides are perpendicular to the second sides.

Optionally, the first sidewall spacer has a thickness ranging from 5 nm to 40 nm in the direction perpendicular to the second sides.

Optionally, the step for forming the source/drain regions comprises:

removing the stopping layer and the first semiconductor layer of a partial thickness in the source/drain regions after the formation of the semiconductor bottom, so as to form source/drain base layers; and forming a second semiconductor layer on the source/drain base layers.

Optionally, the first semiconductor layer contains Si, if the semiconductor device is a PMOS device, the second semiconductor layer is made of $Si_{1-x}Ge_x$; and if the semiconductor device is an NMOS device, the second semiconductor layer is made of Si:C.

Optionally, in the $Si_{1-x}Ge_x$, X has a value ranging from 0.1 to 0.7.

Optionally, in the Si:C, C has an atomic percentage ranging from 0.2% to 2%.

Optionally, the method further comprises the following step before forming the second semiconductor layer on the source/drain base layers:

conducting a first ion implantation in the direction towards the first sides to form a diffusion region and a halo.

Optionally, the step for forming the gates comprises:

forming gate stacks before the defining of the source/drain regions, and wherein in the direction perpendicular to the insulation layer, the gate stacks cover at least the patterned first semiconductor layer.

Optionally, the method further comprises: conducting a second ion implantation in the cavity after the formation of the cavity to form a super-steep retrograde well.

Optionally, the method further includes: filling the cavity with an insulation material.

Optionally, the insulation material is any one or a combination of silicon nitride and silicon oxide.

Compared with the prior art, the technical solutions provided by the invention have the advantages below.

With the cavity formed in the semiconductor base, which has a channel region of the same thickness as the conventional device, the distance between the gates formed on the second sides of the semiconductor base can be increased, and so can the distance between the gate and the source/drain region, bringing a reduction in parasitic capacitances. Moreover, due to the introduced cavity, if the height of the semiconductor base remains, the peripheral area of the semiconductor base that has a channel region thickness the same as the prior art can be increased, hence increasing the cross-sectional area where the source/drain region meets the semiconductor base (This is because the width of the source/drain region is increased), and reducing the resistance of the source/drain region. Furthermore, the introducing of the cavity forms an isolation region between source and drain regions, which may alleviate short-channel effects.

By forming the sacrificial layer as well as the first and second sidewall spacers surrounding the sacrificial layer on the semiconductor layer located on the insulation layer, and then forming the semiconductor base with a self-aligning process by using the first and second sidewall spacers as a mask, the number of masks used may be reduced, and the process may be refined. With the gate made to cover at least the channel region in the direction perpendicular to the first sides, the effective area of the channel region may be increased, and the mobility of carriers in the channel region may be enhanced.

By forming a semiconductor assistant base and then forming the source/drain region on the semiconductor assistant base, the source/drain regions can be formed by epitaxial growth. If the semiconductor assistant base contains Si, then for PMOS devices, the source/drain regions may be made of $Si_{1-x}Ge_x$; and for NMOS devices, the source/drain regions may be made of Si:C. This is good for further adjusting the stress in the channel region with the source/drain regions, and for increasing the mobility of carriers in the channel region. In addition, with the cavity introduced, the counter force imposed on the source/drain regions by a silicon layer filled in the cavity 124 no longer exists, increasing the stress generated by the source/drain regions. Therefore, for the semiconductor base that has a channel region thickness the same as the prior art, the stress in the channel region of the device can be adjusted in a wider range, which may help to further increase the mobility of carriers in the channel region.

By filling the cavity with an insulation material, the possibility of introducing contaminant into the cavity is reduced.

To form the source/drain regions by epitaxial growth, a source/drain base layer (a seed layer, which may be a remaining portion of the first semiconductor layer of a partial thickness) has to be formed in advance. After the formation of the source/drain base layer, the first semiconductor layer on the first sides of the semiconductor base will be partially exposed. Therefore, a first ion implantation may be conducted in the direction towards the first side to form doped regions (e.g., diffusion regions or the halos) in the channel region of the device, which is practicable and can reduce the space between adjacent semiconductor bottoms, hence reducing the area taken by the device and reducing manufacture costs.

By performing a second ion implantation in the cavity after it is formed, a Super-steep Retrograde Well (SSRW) can be formed in the semiconductor base, which may thin the depletion layer and further reduce the short channel effects.

BRIEF DESCRIPTION OF THE DRAWINGS

All the sectional views below are derived from cutting a formed structure by a cutting line (AA') shown in their respective top views.

DETAILED DESCRIPTION OF THE EMBODIMENTS

A number of embodiments or examples implementing the technical solutions provided by the invention are described hereinafter, with particular components and particular arrangements. However, those components and arrangements are for illustration purposes only, and are not intended to limit the scope of the invention.

Moreover, different embodiments of the invention may use the same reference numerals and/or letters, which is for conciseness and clarity purposes, and does not represent the relationships between the embodiments and/arrangements described herein.

The invention provides examples with particular processes and/or materials; however, it shall be appreciated by those skilled in the art that alternative processes and/or materials may be used without deviation from the scope of the invention. It should be noted that, the relationships between the various areas described herein include any necessary extensions required by the process or techniques. For example, the term "perpendicular" refers to an angle between two planes that varies from 90° within a range allowed by the process or techniques.

Figure 2:
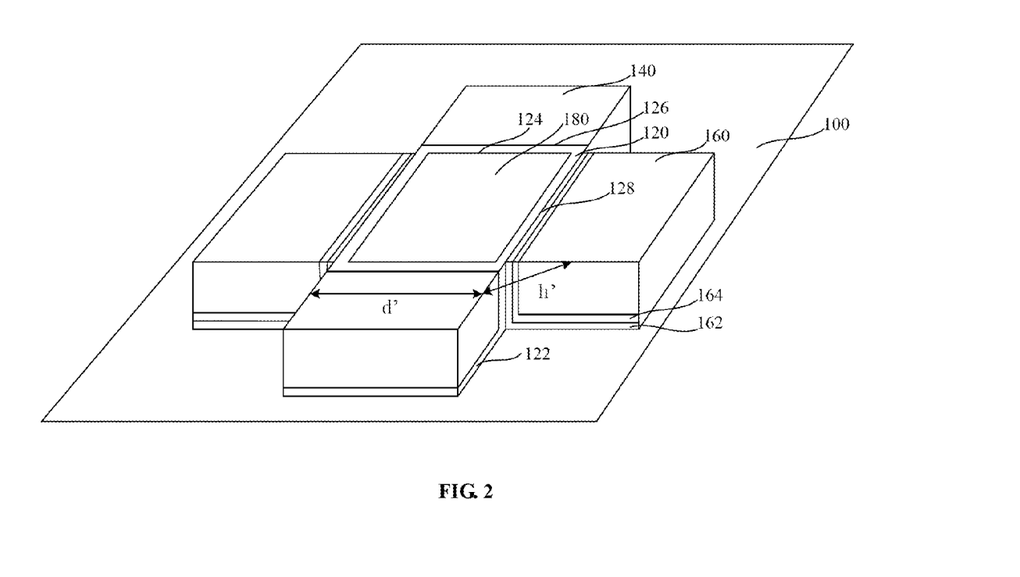
FIG. 2 is a structural diagram of a semiconductor device provided by the present invention.

As shown in FIG. 2, a semiconductor device provided by the invention includes: a semiconductor base 120, which is on an insulation layer 100; source/drain regions 140 abutting the opposite first sides 126 of the semiconductor base 120; and gates 160, on the opposite second sides 128 of the semiconductor base 120. The semiconductor base 120 includes a cavity 124, and the insulation layer 100 is exposed by the cavity 124.

With the cavity 124 formed in the semiconductor base 120, which has a channel region of the same thickness as the conventional device, the distance between the gates 160 formed on the second sides 128 of the semiconductor base 120 can be increased, and so can the distance h' between the gate 160 and the source/drain region 140, and bringing a reduction in parasitic capacitances. Moreover, due to the introduced cavity 124, if the height of the semiconductor base 120 remains, the peripheral area of the semiconductor base 120 that has a channel region thickness the same as the prior art can be increased, hence increasing the cross-sectional area where the source/drain region 140 meets the semiconductor base 120 (This is because the width d' of the source/drain region 140 is increased), and reducing the resistance of the source/drain region 140. Furthermore, the introducing of the cavity 124 forms an isolation region between source and drain regions 140, which may alleviate short-channel effects.

Specifically, the semiconductor base 120 may be silicon formed on the insulation layer 100, and doped regions (e.g., diffusion regions or halos) are formed in the semiconductor base 120, to provide the channel region of the device. In a semiconductor device embodiment of the invention, a channel layer and a mask layer are sandwiched between each of the second sides 128 and the cavity 124, and the channel layer is sandwiched between the insulation layer 100 and the mask layer. The channel layer may be made of silicon (with a doped region formed), and in the direction perpendicular to the second side, the thickness of the channel layer is 5 nm~40 nm. The mask layer may be made of silicon nitride, or stacked silicon oxide and silicon nitride. For NMOS devices, the channel layer may include a P-type SSRW. For PMOS devices, the channel layer may include an N-type SSRW. Specifically, the first side may be perpendicular to the second side.

The semiconductor device may further include a semiconductor assistant base 122 on each of the first sides 126, and the source/drain region 140 may be formed on the semiconductor assistant base 122. As an example, the semiconductor assistant base 122 may also be made of silicon, and the source/drain regions 140 may be formed on the semiconductor assistant base 122 by ion implantation. Moreover, the upper surface of the semiconductor assistant base 122 may be lower than the upper surface of the semiconductor base 120. In this specification, the term "upper surface" refers to a side of the semiconductor assistant base 122 or the semiconductor base 120 that is parallel to the insulation layer 100. The source/drain regions 140 may be formed on the semiconductor assistant base 122 by epitaxial growth. If the semiconductor assistant base 122 contains Si, then for PMOS devices, the source/drain regions 140 may be made of $Si_{1-X}Ge_X$ (with X ranging from 0.1~0.7 adjustable according to process requirements, e.g., 0.2, 0.3, 0.4 or 0.6. The value of X is similar in other parts of this specification, therefore the discussion of which will be omitted); and for NMOS devices, the source/drain regions 140 may be made of Si:C (with C having an atomic percentage of 0.2%~2%, e.g., 0.5%, 1% or 1.5% adjustable according to process requirements. The atomic percentage of C is similar in other parts of this specification, the discussion of which will be omitted). This is good for further adjusting the stress in the channel region with the source/drain regions 140, and for increasing the mobility of carriers in the channel region. In addition, with the cavity 124 introduced, the counter force imposed on the source/drain regions 140 by a silicon layer filled in the cavity 124 no longer exists, increasing the stress generated by the source/drain regions 140. Therefore, for the semiconductor base 120 that has a channel region thickness the same as the prior art, the stress in the channel region of the device can be adjusted in a wider range, which may help to further increase the mobility of carriers in the channel region.

The gates 160 may be formed on each of the second sides 128 with stacked gate dielectric layer 162 and work-function metal layer 164. The gate dielectric layer 162 may be made of a hafnium-based material, e.g., any one or more of: $HfO_2$, HfSiO, HfSiON, HfTaO, HfSiO and HfZrO. The work-function metal layer 164 may include any one or more of: TiN, TiAlN, TaN and TaAlN. The gates 160 may be metal gates, preferably polysilicon gates, for better process control. In the direction perpendicular to the insulation layer 100, the gates 160 cover at least the channel layer.

In a semiconductor device embodiment of the invention, the cavity 124 may be filled with an insulation material 180, to reduce the possibility of introducing contaminant into the cavity. The insulation material 180 may be any one or more of: silicon nitride and silicon oxide.

The present invention also provides a method for forming a semiconductor device.

Figure 3:
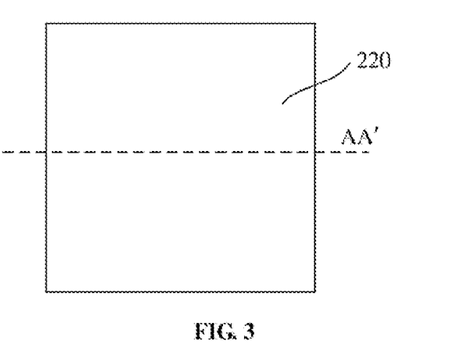
FIG. 3 and FIG. 4 are a top view and a sectional view of a semiconductor device being formed according to a method embodiment of the invention with material layers for forming the semiconductor device formed on a substrate.
Figure 4:
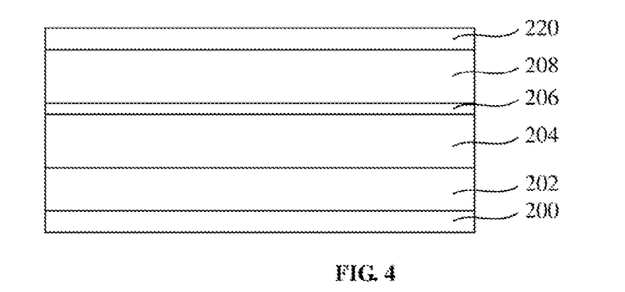
Figure 5:
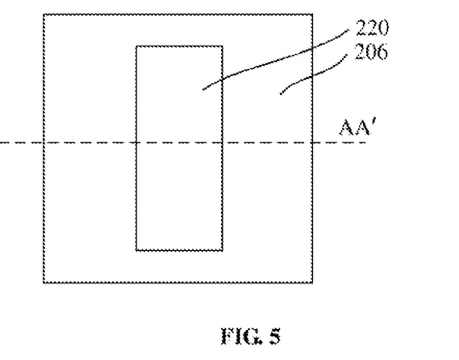
FIG. 5 and FIG. 6 are a top view and a sectional view of a semiconductor device being formed according to a method embodiment of the invention with a protection layer and a sacrificial layer patterned.
Figure 6:
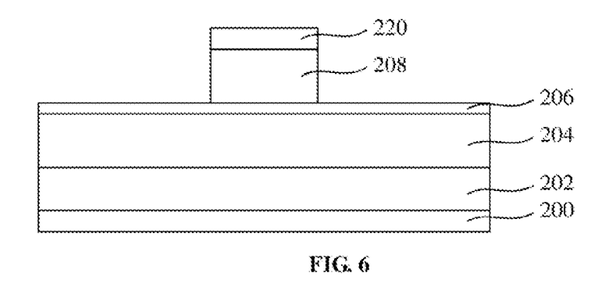
Figure 7:
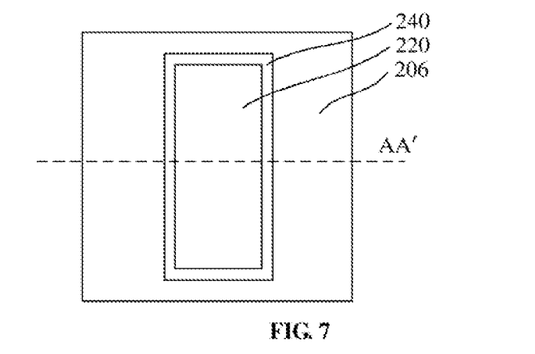
FIG. 7 and FIG. 8 are a top view and a sectional view of a semiconductor device being formed according to a method embodiment of the invention with a first sidewall spacer formed.
Figure 8:
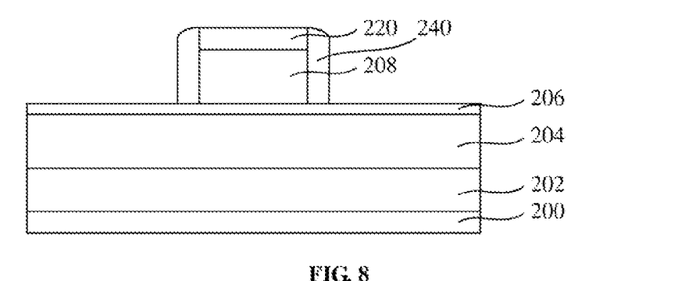

First, as shown in FIG. 3 and FIG. 4, a stopping layer 206 (e.g., silicon oxide), a sacrificial layer 208 (e.g., amorphous silicon) and a protection layer 220 (e.g., silicon carbide) are formed in that order on an SOI (Its silicon layer is the first semiconductor layer, which may be made of other semiconductor materials. The SOI includes an insulation layer 202 and a silicon layer 204 formed in that order on a substrate 200. Preferably, the substrate 200 is a silicon substrate). Next, as shown in FIG. 5 and FIG. 6, the protection layer 220 and the sacrificial layer 208 are patterned with, e.g., an etch, which stops at the stopping layer 206. Then, as shown in FIG. 7 and FIG. 8, a first sidewall spacer 240 is formed surrounding the patterned protection layer 220 and sacrificial layer 208. The first sidewall spacer 240 may be made of silicon nitride with, e.g., an etch-back process. Specifically, the first side may be perpendicular to the second side.

In particular, the silicon layer 204 may have a thickness of 50 nm~100 nm, e.g., 60 nm, 70 nm, 80 nm or 90 nm. The stopping layer 206 may have a thickness of 5 nm~20 nm, e.g., 8 nm, 10 nm, 15 nm or 18 nm. The sacrificial layer 208 may have a thickness of 30 nm~80 nm, e.g., 40 nm, 50 nm, 60 nm or 70 nm. The protection layer 220 may have a thickness of 20 nm~50 nm, e.g., 25 nm, 30 nm, 35 nm or 40 nm. In the direction perpendicular to the second side, the thickness of first sidewall spacer 240 may be 5 nm~40 nm, e.g., 10 nm, 20 nm, 25 nm or 30 nm.

Figure 9:
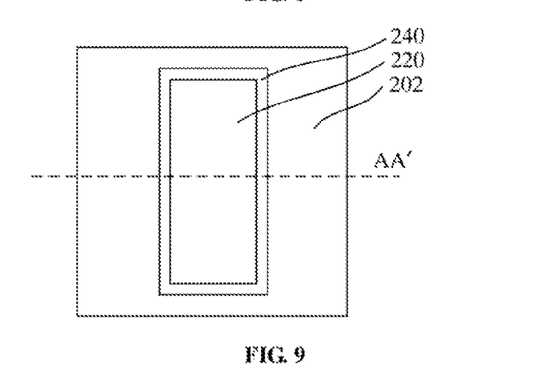
FIG. 9 and FIG. 10 are a top view and a sectional view of a semiconductor device being formed according to a method embodiment of the invention with a stopping layer and a silicon layer patterned.
Figure 10:
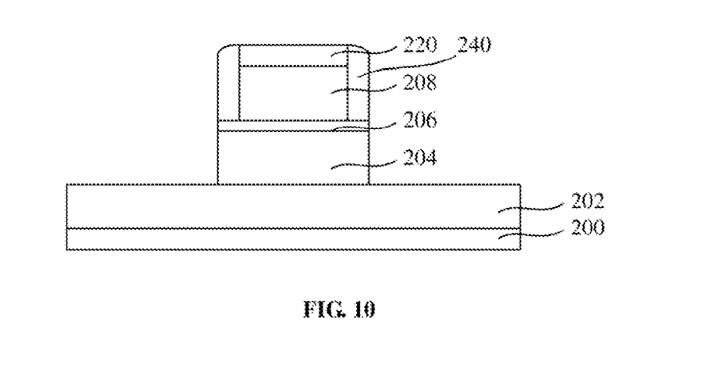
Figure 11:
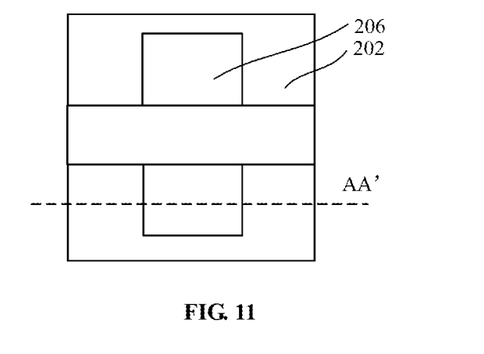
FIG. 11 and FIG. 12 are a top view and a sectional view of a semiconductor device being formed according to a method embodiment of the invention with the stopping layer in a source/drain region exposed.
Figure 12:
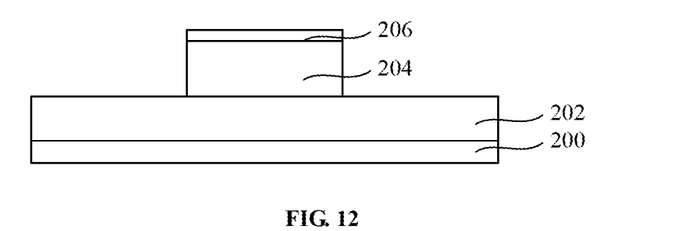
Figure 13:
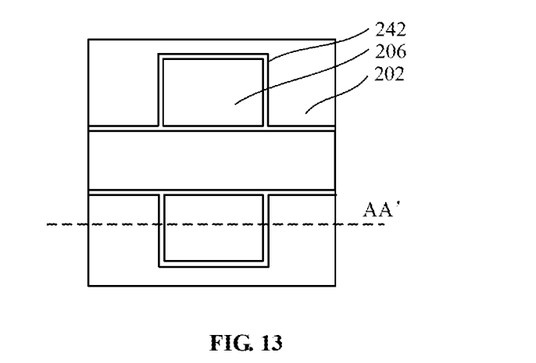
FIG. 13 and FIG. 14 are a top view and a sectional view of a semiconductor device being formed according to a method embodiment of the invention with a second sidewall spacer formed.
Figure 14:
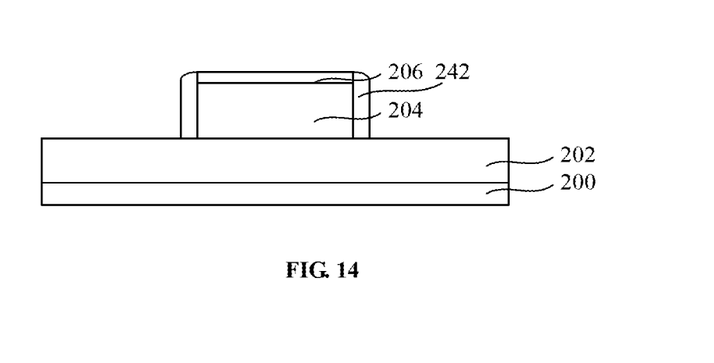

Subsequently, as shown in FIG. 9 and FIG. 10, the stopping layer 206 and the silicon layer 204 are patterned using the first sidewall spacer 240 as a mask. The patterning may be performed with etching which stops at the insulation layer 202. Then, as shown in FIG. 11 and FIG. 12, the source/drain regions are defined, and the sacrificial layer 208, the protection layer 220 and the first sidewall spacer 240 in the regions are removed to expose the stopping layer 206 (A hard mask may be formed in regions that are not source/drain regions. The hard mask may be formed on the protection layer 220 in the above steps, and may be removed in an appropriate step, e.g., after exposing the stopping layer 206 in the source/drain regions). Meanwhile, the side surfaces of the sacrificial layer 208 and the protection layer 220 that meet the source/drain regions are also exposed (not shown). Subsequently, as shown in FIG. 13 and FIG. 14, a second sidewall spacer 242 (e.g., silicon nitride) is formed around the protection layer 220, the sacrificial layer 208, the patterned stopping layer 206 and the silicon layer 204. Accordingly, a semiconductor bottom is formed. Then, after the formation of the source/drain regions and the gate, the protection layer 220, the sacrificial layer 208, the stopping layer 206 and the silicon layer 204 are removed using the first sidewall spacer 240 and the second sidewall spacer 242 as a mask to expose the insulation layer 202, thereby forming the semiconductor device having a cavity. Since the semiconductor bottom (from which the semiconductor base is formed) is formed in a self-aligning way, the number of masks used may be reduced, and the process may be refined. The second sidewall spacer 242 may have a thickness of 7 nm~20 nm, e.g., 10 nm, 15 nm or 18 nm.

It should be noted that, the gate (actually a gate stack including the gate. The gate stack includes a stack of a gate dielectric layer, a work-function metal layer and a polysilicon layer. Alternatively, the polysilicon layer may be replaced with a stacked metal layer) may be formed after patterning the stopping layer and the silicon layer and before exposing the stopping layer in the source/drain regions.

Figure 15:
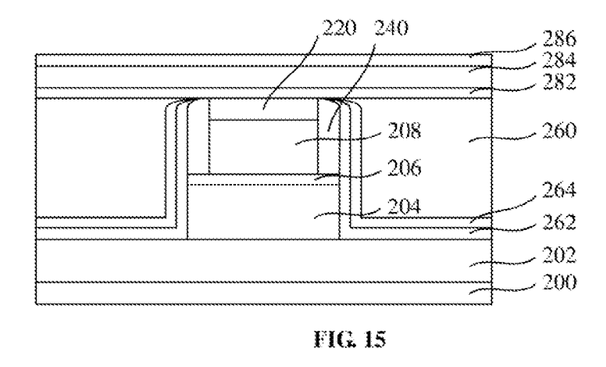
FIG. 15 is a sectional view of a semiconductor device being formed according to a method embodiment of the invention with a gate stack formed following the steps represented by FIG. 9 and FIG. 10.

Specifically, as shown in FIG. 15, when the stopping layer 206 and the silicon layer 204 are patterned (shown in FIG. 9 and FIG. 10), the gate stack (including a gate dielectric layer 262, a work-function metal layer 264 and a gate material layer 260 stacked sequentially. The gate dielectric layer 262 may be made of a hafnium-based material, e.g., any one or more of: $HfO_2$, HfSiO, HfSiON, HfTaO, HMO and HfZrO. The work-function metal layer 264 may include any one or more of: TiN, TiAlN, TaN and TaAlN. The gate material layer 260 may be made of metal, preferably polysilicon) is formed on the insulation layer 202. Then, the gate stack is planarized, to expose the protection layer 220. Subsequently, an assistant mask layer is formed over the gate stack layer and the protection layer 220. The assistant mask layer may include stacked dielectric layers of different materials. For example, if the protection layer 220 and the first sidewall spacer 240 are made of silicon nitride, the assistant mask layer may have a structure of silicon oxide layer (first assistant mask layer 282)—silicon nitride layer (second assistant mask layer 284)—silicon oxide layer (third assistant mask layer 286). After the steps above, only the silicon oxide layer is visibly seen from the top of the substrate bearing the above structures. After that, and before forming the semiconductor bottom, the assistant mask layer and the gate stack layer in the source/drain regions have to be removed. The method above for forming a gate is resulted from a thorough consideration regarding manufacturing techniques, and is the basis for the description below. It should be noted that, the gate may be formed with other methods, and the gate may also be formed after the formation of the source/drain regions. Based on the teachings provided by the present invention, those skilled in the art can form the gate in a flexible manner, the description of which is therefore omitted here.

Specifically, the gate dielectric layer 262 may have a thickness of 2 nm~3 nm, e.g., 2.5 nm. Furthermore, an interfacial oxide layer may be formed prior to the formation of the gate dielectric layer 262. The interfacial oxide layer may have a thickness of 0.2 nm~0.7 nm, e.g., 0.5 nm, not shown in the figure. The work-function metal layer 264 may have a thickness of 3 nm~10 nm, e.g., 5 nm or 8 nm. The gate material layer 260 may have a thickness of 50 nm~100 nm, e.g., 60 nm, 70 nm, 80 nm or 90 nm. The first assistant mask layer 282 may have a thickness of 2 nm~5 nm, e.g., 3 nm or 4 nm. The second assistant mask layer 284 may have a thickness of 10 nm~20 nm, e.g., 12 nm, 15 nm or 18 nm. The third assistant mask layer 286 may have a thickness of 10 nm~20 nm, e.g., 12 nm, 15 nm or 18 nm. The source/drain base layer may have a thickness of 5 nm~20 nm, e.g., 10 nm or 15 nm.

Figure 16:
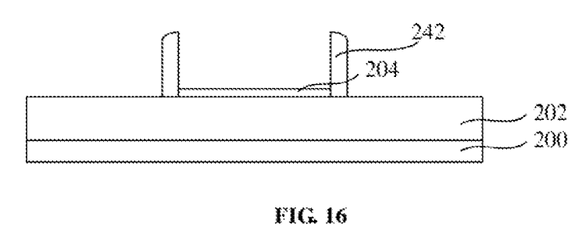
FIG. 16 is a sectional view of a semiconductor device being formed according to a method embodiment of the invention with a source/drain base layer formed in the source/drain region.
Figure 17:
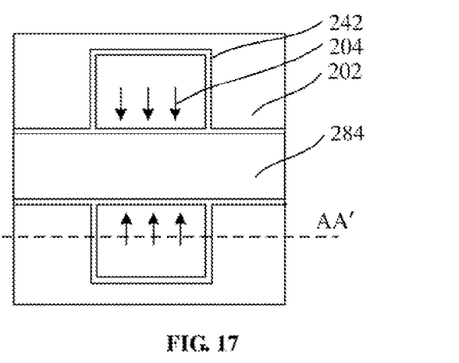
FIG. 17 is a sectional view of a semiconductor device being formed according to a method embodiment of the invention with first ion implantation performed.
Figure 18:
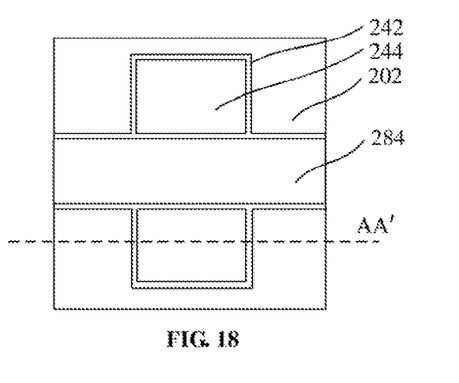
FIG. 18 and FIG. 19 are a top view and a sectional view of a semiconductor device being formed according to a method embodiment of the invention with a second semiconductor layer formed on the source/drain base layer.
Figure 19:
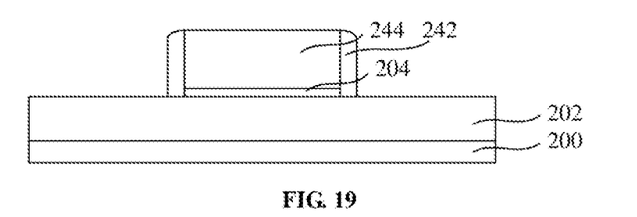

In practice, as shown in FIG. 16, after the formation of the semiconductor bottom, the stopping layer 206 and the silicon layer 204 of a partial thickness, which are in the source/drain regions, are removed (meanwhile, the first assistant mask 286, i.e., the silicon oxide layer, on the gate stack layer is also removed) to form the source/drain base layer (i.e., the semiconductor assistant base). Subsequently, as shown in FIG. 17, a first ion implantation may be conducted in the direction (represented by the arrows in the figure) towards the first sides (said first sides now are the silicon layer surfaces exposed after the removal of the silicon layer of a partial thickness) to form diffusion regions and halos in the silicon layer 204. Compared with the prior art, where the first ion implantation is conducted in the direction towards the second sides, the present method is more practicable and can reduce the dimension between adjacent semiconductor bottoms, hence reducing the area taken by the device and reducing manufacture costs. Details of the first ion implantation, e.g. ion energy, implantation dose, number of times, and dopants, may be adjusted as needed, which are therefore omitted here. Then, as shown in FIGS. 18 and 19, after a second semiconductor layer 244 (for PMOS devices, the second semiconductor layer 244 may be made of $Si_{1-X}Ge_X$, with a doping dose of $1\times10^{19}/cm^3 \sim 1\times10^{21}/cm^3$; and for NMOS devices, the second semiconductor layer 244 may be made of Si:C, with a doping dose of $1\times10^{19}/cm^3 \sim 1\times10^{21}/cm^3$) is formed on the source/drain base layer by epitaxial growth, the source/drain regions are formed. The source/drain regions can be used to adjust the stress in the channel region, so as to further enhance the mobility of carriers in the channel region. On the other hand, after the removal of the stopping layer 206 in the source/drain regions, the source/drain regions may also be formed by conducting an ion implantation into the silicon layer 204 without removing the silicon layer 204 of a partial thickness.

Figure 20:
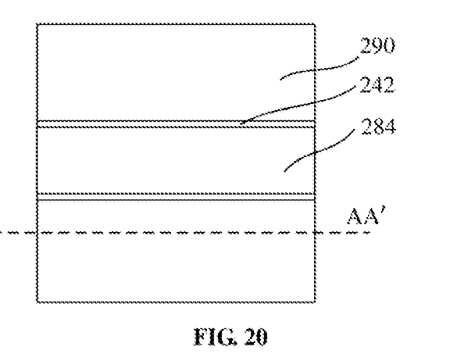
FIG. 20 and FIG. 21 are a top view and a sectional view of a semiconductor device being formed according to a method embodiment of the invention with a flattened first dielectric layer formed.
Figure 21:
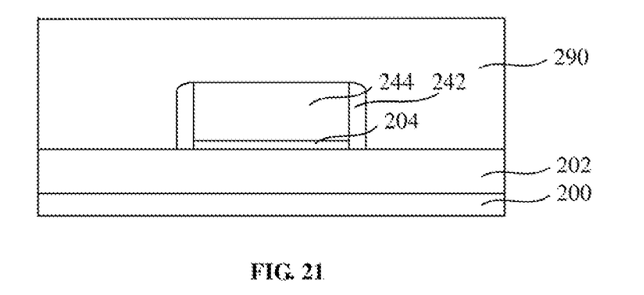
Figure 22:
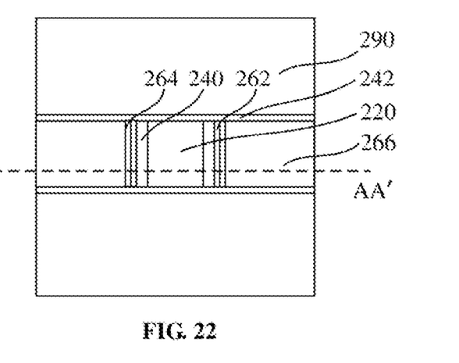
FIG. 22 and FIG. 23 are a top view and a sectional view of a semiconductor device being formed according to a method embodiment of the invention with a gate formed.
Figure 23:
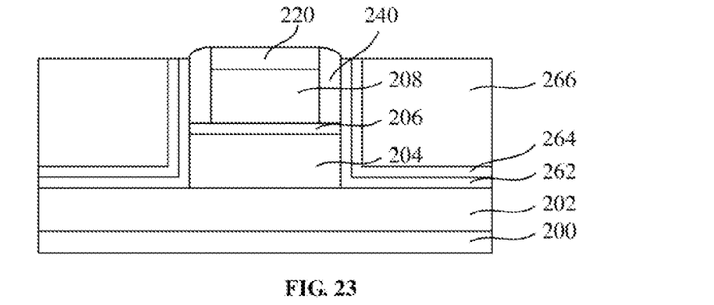
Figure 24:
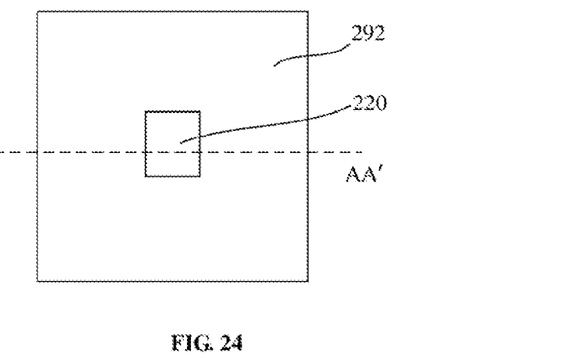
FIG. 24 and FIG. 25 are a top view and a sectional view of a semiconductor device being formed according to a method embodiment of the invention with a flattened second dielectric layer formed.
Figure 25:
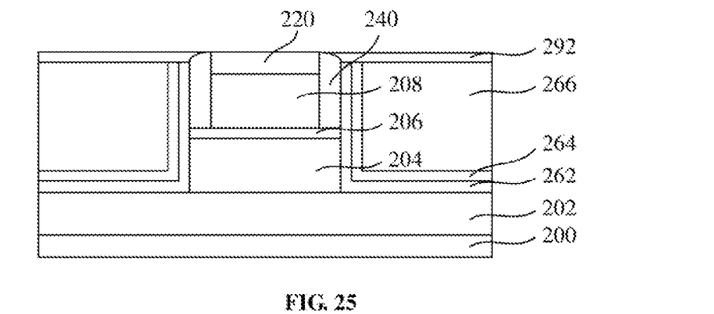
Figure 26:
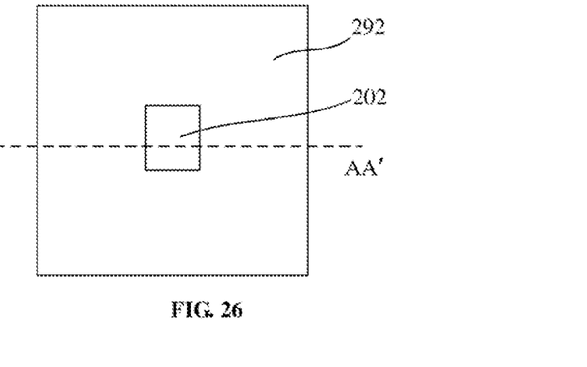
FIG. 26 and FIG. 27 are a top view and a sectional view of a semiconductor device being formed according to a method embodiment of the invention with a cavity formed.
Figure 27:
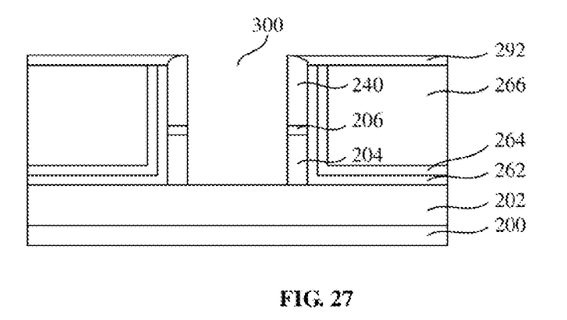

Then, the cavity is formed. First, as shown in FIG. 20 and FIG. 21, a planarized first dielectric layer 290 (e.g., silicon oxide) is formed, and the second assistant mask layer 284 in the assistant mask layers is exposed, by e.g., Chemical Mechanical Polishing (CMP). Then, as shown in FIG. 22 and FIG. 23, the remaining second assistant mask layer 284 (silicon nitride layer), the first assistant mask layer 282 (silicon oxide layer), and the remaining gate stack structure are removed to form a gate 266. In the thickness direction of the silicon layer 204, the gate 266 covers at least the silicon layer 204 (which is for the channel), which may increase the effective area of the channel region in the device and thus increase the mobility of carriers in the channel region. After this step, the protection layer 220 of a partial thickness is left. Then, as shown in FIG. 24 and FIG. 25, a second dielectric layer 292 (e.g., silicon oxide, for reducing damages to the existing structure during the removal of the protection layer 220 to form the cavity) is formed. The second dielectric layer 292 exposes the protection layer 220 and covers the first sidewall spacer 240 and the second sidewall spacer 242, which may be carried out by firstly depositing the second dielectric layer 292 and then performing CMP on the second dielectric layer 292. Subsequently, as shown in FIG. 26 and FIG. 27, the protection layer 220, the sacrificial layer 208, the stopping layer 206 and the silicon layer 204 are removed with the second dielectric layer as a mask to expose the insulation layer 202, so as to form a cavity 300. It should be noted that, due to the protection of the second dielectric layer 292, damages to other structures are reduced during the formation of the cavity 300. However, the shape of the cavity 300 is determined by the first sidewall spacer 240 and the second sidewall spacer 242. Therefore, the first sidewall spacer 240 and the second sidewall spacer 242 also act as a mask to some extent. Thus, the cavity 300 is formed after the formation of the source/drain regions, and the counter force on the source/drain regions by the sacrificial layer 208, the stopping layer 206, and the silicon layer 204 (the first semiconductor layer), which are originally filling in the cavity 300, no longer exists, leading to a smaller loss of stress generated by the source/drain regions.

Figure 28:
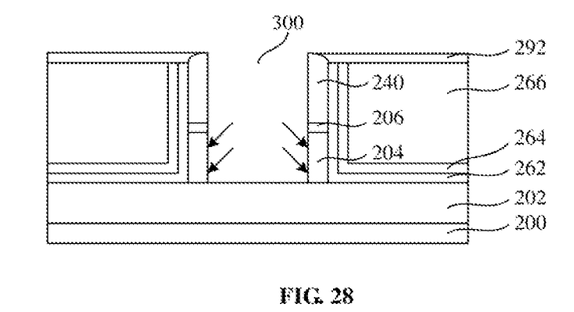
FIG. 28 is a sectional view of a semiconductor device being formed according to a method embodiment of the invention with second ion implantation performed.

Next, as shown in FIG. 28, after the formation of the cavity 300, a second ion implantation is performed in the cavity 300 (in the direction represented by the arrows in the figure) to form SSRWs in the silicon layers 204 (which is for providing the channel). Specifically, for NMOS devices, the channel layers include P-type SSRWs; and for PMOS devices, the channel layers include N-type SSRWs. This is good for thinning the depletion layer and mitigating short-channel effects. Details of the second ion implantation, e.g. ion energy, implantation dose, number of times, and dopants, can be adjusted as needed, which are therefore omitted here.

Figure 29:
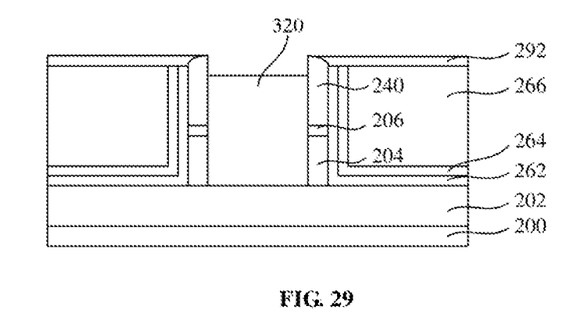
FIG. 29 is a sectional view of a semiconductor device being formed according to a method embodiment of the invention with the cavity filled with a third dielectric layer.

Then, as shown in FIG. 29, the cavity 300 is filled with a third dielectric layer 320 by an etch-back process. The third dielectric layer 320 is made of an insulation material (If the third dielectric layer 320 needs to be removed after the formation of the gate 266, the third dielectric layer 320 may be made of a material different from the materials of the second dielectric layer 292, the first sidewall spacer 240, the stopping layer 206 and the silicon layer 204. For example, it may be silicon carbide. If the third dielectric layer 320 needs to be kept after the formation of the gate 266, the third dielectric layer 320 may be made of any material different from the material of the second dielectric layer 292. For example, it may be silicon nitride). Filling the cavity 300 with an insulation material may reduce the possibility of introducing contaminant into the cavity. The insulation material may be any one or more of: silicon nitride and silicon oxide. Now, the semiconductor device is completed.

Figure 30:
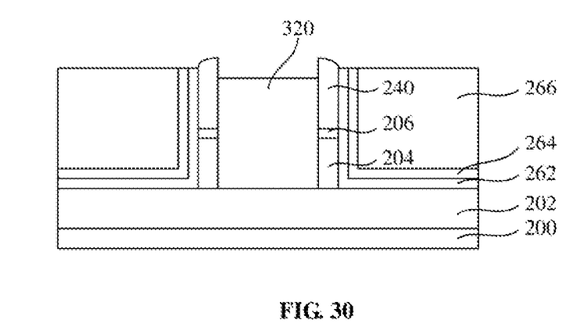
FIG. 30 and FIG. 31 are sectional views of a semiconductor device being formed according to a method embodiment of the invention with the second dielectric layer removed and the gate and the source/drain region exposed.
Figure 31:
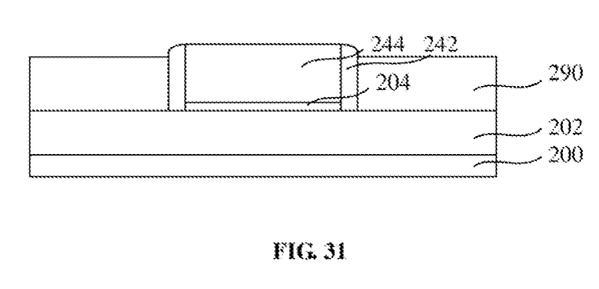
Figure 32:
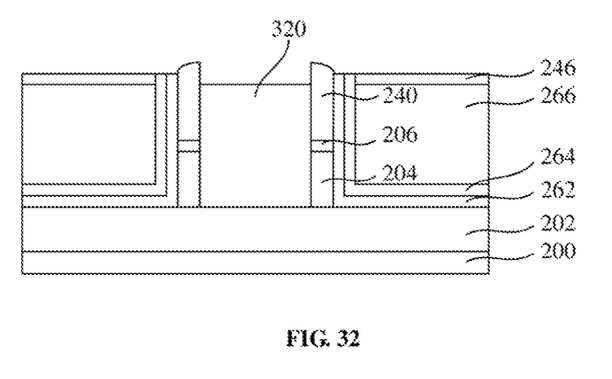
FIG. 32 and FIG. 33 are sectional views of a semiconductor device being formed according to a method embodiment of the invention with a contact region formed on the gate and the source/drain region.
Figure 33:
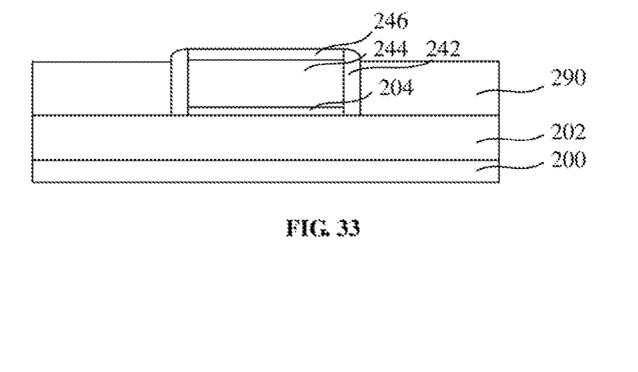

Subsequently, as shown in FIG. 30 and FIG. 31, the second dielectric layer 292 is removed to expose the gate 266 and the source/drain regions 244. Further, as shown in FIG. 32 and FIG. 33, a metal layer is formed on the gate 266 and the source/drain regions 244, and a heat treatment is performed. Then, the unreacted metal layer is removed, and thus, a metal silicide layer 246 (i.e., contact regions, for reducing contact resistance in forming metal interconnections) is formed on the gate 266 and the source/drain regions 244.

Furthermore, the scope of the invention is not limited to the processes, structures, manufacturing, materials, means, methods, and steps described in the specific embodiments here. Based on the disclosure of the invention, those skilled in the art shall appreciate that, for those processes, structures, manufacturing, materials, means, methods or steps known or to be developed, as long as their functions or effects are substantially the same as those in the corresponding embodiments described here, they are applicable without deviation from the scope of the invention.

What is claimed is:

1. A semiconductor device, comprising:
   a semiconductor base on an insulation layer, wherein the semiconductor base includes opposite first sides and opposite second sides, wherein the opposite first sides and opposite second sides are located at periphery of the semiconductor base and the semiconductor base is surrounded by the opposite first sides and opposite second sides;
   a source region abutting one side of the opposite first sides and located outside the semiconductor base;
   a drain region abutting the other side of the opposite first sides and located outside the semiconductor base;
   a first gate at one side of the opposite second sides; and
   a second gate at the other side of the opposite second sides of the semiconductor base,
   wherein a cavity is located in the semiconductor base, wherein the cavity is filled with an insulation material, the insulation layer is directly contacted with the insulation material and the insulation material is surrounded by the semiconductor base on at least four vertical sides.

2. The semiconductor device according to claim 1, wherein, a channel layer and a mask layer are sandwiched between each of the opposite second sides and the cavity, and the channel layer is sandwiched between the insulation layer and the mask layer.

3. The semiconductor device according to claim 1, wherein, the opposite first sides are perpendicular to the opposite second sides.

4. The semiconductor device according to claim 2, wherein, the channel layer has a thickness of 5 nm to 40 nm in the direction perpendicular to the opposite second sides.

5. The semiconductor device according to claim 2, wherein, if the semiconductor device is an NMOS device, the channel layer comprises a P-type super-steep retrograde well; and if the semiconductor device is a PMOS device, the channel layer comprises an N-type super-steep retrograde well.

6. The semiconductor device according to claim 2, wherein, in the direction perpendicular to the insulation layer, the gate covers at least the channel layer.

7. The semiconductor device according to claim 1, wherein, the semiconductor device further comprises a semiconductor assistant base, and wherein the upper surface of the semiconductor assistant base is lower than the upper surface of the semiconductor base, the semiconductor assistant base abutting the opposite first sides, and the source and drain regions are formed on the semiconductor assistant base.

8. The semiconductor device according to claim 7, wherein, the semiconductor assistant base contains Si, if the semiconductor device is a PMOS device, the source and drain regions are made of $Si_{1-x}Ge_x$; and if the semiconductor device is an NMOS device, the source and drain regions are made of Si:C.

9. The semiconductor device according to claim 8, wherein, the semiconductor device is the PMOS device, and in the $Si_{1-x}Ge_x$, X has a value ranging from 0.1 to 0.7.

10. The semiconductor device according to claim 8, wherein, the semiconductor device is the NMOS device, and in the Si:C, C has an atomic percentage ranging from 0.2% to 2%.

11. The semiconductor device according to claim 1, wherein, the insulation material is any one or a combination of: silicon nitride and silicon oxide.

12. A method for forming a semiconductor device, comprising:
    forming a semiconductor base on an insulation layer, wherein the semiconductor base includes opposite first sides and opposite second sides, wherein the opposite first sides and opposite second sides are located at periphery of the semiconductor base and the semiconductor base is surrounded by the opposite first sides and opposite second sides;
    forming a source region and a drain region, the source region abutting one side of the opposite first sides and located outside the semiconductor base and the drain region abutting the other side of the opposite first sides and located outside the semiconductor base;
    forming a first gate and a second gate, wherein the first gate is at one side of opposite second sides, and the second gate is at the other side of the opposite second sides; and
    removing a part of the semiconductor base to form a cavity in the semiconductor base, wherein the cavity exposes the insulation layer;
    wherein, the method further comprises: filling the cavity with an insulation material;
    wherein the insulation material is surrounded by the semiconductor base on at least four vertical sides.

13. The method according to claim 12, wherein, the step for forming a semiconductor bottom comprises:
    forming a first semiconductor layer, a stopping layer, a patterned sacrificial layer, a patterned protection layer, and a first sidewall spacer surrounding the patterned sacrificial layer and protection layer;
    forming patterned stopping layer and first semiconductor layer by using the first sidewall spacer as a mask;

defining the source/drain regions, and removing the first sidewall spacer, the protection layer, and the sacrificial layer over the regions to expose the stopping layer; and forming a second sidewall spacer surrounding the protection layer and the sacrificial layer, and wherein, the step for forming the cavity in the semiconductor bottom comprises:

removing the protection layer, the sacrificial layer and the first semiconductor layer by using the first sidewall spacer and the second sidewall spacer as a mask, wherein the material of the stopping layer is different from that of the protection layer, the sacrificial layer, the first semiconductor layer, the first sidewall spacer or the second sidewall spacer.

14. The method according to claim 12, wherein, the opposite first sides are perpendicular to the opposite second sides.

15. The method according to claim 13, wherein, the first sidewall spacer has a thickness ranging from 5 nm to 40 nm in the direction perpendicular to the opposite second sides.

16. The method according to claim 13, wherein, the step for forming the source region and the drain region comprises:

removing the stopping layer and the first semiconductor layer of a partial thickness in the source region and the drain region after the formation of the semiconductor base, so as to form a source base layer and a drain base layer; and forming a second semiconductor layer on each of the source base layer and the drain base layer.

17. The method according to claim 16, wherein, the first semiconductor layer contains Si, if the semiconductor device is a PMOS device, the second semiconductor layer is made of $Si_{1-X}Ge_X$; and if the semiconductor device is an NMOS device, the second semiconductor layer is made of Si:C.

18. The method according to claim 17, wherein, the semiconductor device is the PMOS device, and in the $Si_{1-X}Ge_X$, X has a value ranging from 0.1 to 0.7.

19. The method according to claim 17, wherein, the semiconductor device is the NMOS device, and in the Si:C, C has an atomic percentage ranging from 0.2% to 2%.

20. The method according to claim 16, wherein, the method further comprises the following step before forming the second semiconductor layer on each of the source base layer and the drain base layer:

conducting a first ion implantation in the direction towards the opposite first sides to form a diffusion region and a halo.

21. The method according to claim 13, wherein, the step for forming the first gate and the second gate comprises:

forming gate stacks before the defining of the source region and the drain region, and wherein in the direction perpendicular to the insulation layer, the gate stacks cover at least the patterned first semiconductor layer.

22. The method according to claim 20, wherein, the method further comprises: conducting a second ion implantation in the cavity after the formation of the cavity to form a super-steep retrograde well.

23. The method according to claim 12, wherein, the insulation material is any one or a combination of silicon nitride and silicon oxide.

* * * * *